(12) United States Patent
Wei et al.

(10) Patent No.: US 9,893,107 B2
(45) Date of Patent: Feb. 13, 2018

(54) SEMICONDUCTOR DEVICE WITH REDUCED LEAKAGE CURRENT AND FABRICATING METHOD THEREOF

(71) Applicant: TAIWAN SEMICONDUCTOR MANUFACTURING CO., LTD., Hsinchu (TW)

(72) Inventors: Chia-Yu Wei, Tainan (TW); Hsin-Chi Chen, Tainan (TW); Ssu-Chiang Weng, New Taipei (TW); Yung-Lung Hsu, Tainan (TW); Yen-Liang Lin, Tainan (TW); Chin-Hsun Hsiao, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/857,657

(22) Filed: Sep. 17, 2015

(65) Prior Publication Data

US 2017/0084657 A1    Mar. 23, 2017

(51) Int. Cl.
*H01L 27/146* (2006.01)

(52) U.S. Cl.
CPC .... *H01L 27/14643* (2013.01); *H01L 27/1463* (2013.01); *H01L 27/14689* (2013.01); *H01L 27/14609* (2013.01)

(58) Field of Classification Search
CPC ......... H01L 27/14609; H01L 27/14643; H01L 27/14603; H01L 27/14689; H01L 27/1463
See application file for complete search history.

(56) References Cited

U.S. PATENT DOCUMENTS

| | | | |
|---|---|---|---|
| 2007/0158709 A1* | 7/2007 | Mouli | H01L 27/14601 257/291 |
| 2007/0241372 A1* | 10/2007 | Kao | H01L 27/14609 257/233 |
| 2012/0242875 A1* | 9/2012 | Nakamura | H01L 27/14607 348/294 |
| 2015/0249102 A1* | 9/2015 | Terada | H01L 27/1464 257/444 |

* cited by examiner

*Primary Examiner* — Marcos D Pizarro
*Assistant Examiner* — Long H Le
(74) *Attorney, Agent, or Firm* — Maschoff Brennan (57) ABSTRACT

A semiconductor device and a manufacturing method thereof are provided. The semiconductor device includes a substrate, a light sensing feature, a negative oxide layer, a gate dielectric layer and a transfer gate. The light sensing feature is configured in the substrate to detect an incoming radiation. The negative oxide layer is over the light sensing feature. The gate dielectric layer is over the negative oxide layer. The transfer gate is over the gate dielectric layer.

20 Claims, 10 Drawing Sheets

SEMICONDUCTOR DEVICE WITH REDUCED LEAKAGE CURRENT AND FABRICATING METHOD THEREOF

BACKGROUND

Image sensors such as complementary metal-oxide semiconductor (CMOS) image sensors (CIS) are used for sensing an imcoming radiation projected towards a semiconductor substrate and widely used in various applications such as video camera, digital still camera and the like. These devices utilize an array of pixels or image sensor elements, to collect photo energy to convert images into electrical signals.

A pixel of CMOS image sensor includes a photo detector such as a photodiode, photogate detector, or phototransistor. However, defects may occur during fabricating the CMOS image sensors, thereby generating noises of pixels. Accordingly, a CMOS image sensor has to be continuously improved so as to obtain a more satisfactory device.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular forms "a," "an" and "the" include plural referents unless the context clearly dictates otherwise. Therefore, reference to, for example, a gate stack includes aspects having two or more such gate stacks, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

For all kind of image sensors such as CMOS image sensors, improvement in sensitivity and noise reduction are important issues. In particular, an excessive leakage current (e.g. dark current) flowing through light sensing features such as photomultiplier tube (PMT), photodiode (PD), or charge-coupled device (CCD), is one of the sources of noise. That is, even if a pixel is in the dark, the pixel still shows that there is a bright light source exists. Such defective pixel is called "white pixel" because whether an imcoming radiation of an image comes or not, the defective pixel may always show "white." In particular, such white pixels are caused by the so-called "bird's beak" effect (i.e., bird's beak induced unwanted current). Excessive and unwanted leakage current can occur in regions that are subjected to excessive mechanical stress during fabrication, or to regions that are subjected to excessive electrical stress during device operation. Some minute defects caused by these excessive stresses may lead to leakage current.

A traditional technique of suppressing generation of a dark current is implantation of a P+ layer on a light sensing region. In order to form a sufficient P+ layer by performing an ion implantation into the light sensing region in high concentration, annealing in high temperature is essential to activate injected impurities since the light sensing region may be damaged by the ion implantation. However, diffusion of impurities occurs and a photoelectric conversion characteristic of the light sensing region deteriorates in this case. Thus, forming the P+ layer by ion implantation and annealing is not preferable. On the other hand, when the ion implantation is performed in low concentration in order to reduce damage caused by the ion implantation, the dopant concentration of the P+ layer lowers. As a result, such P+ layer with low dopant concentration is not sufficient to reduce the dark current. That is, it is difficult to realize a sufficient P+ layer and to reduce the dark current while a desired photoelectric conversion characteristic is maintained by suppressing diffusion of impurities.

In order to solve the above-mentioned problems, the present disclosure provides a semiconductor device and a method of manufacturing the same, which is beneficial for preventing and reducing leakage current. Therefore, the performance of white pixel may be improved.

Figure 1:
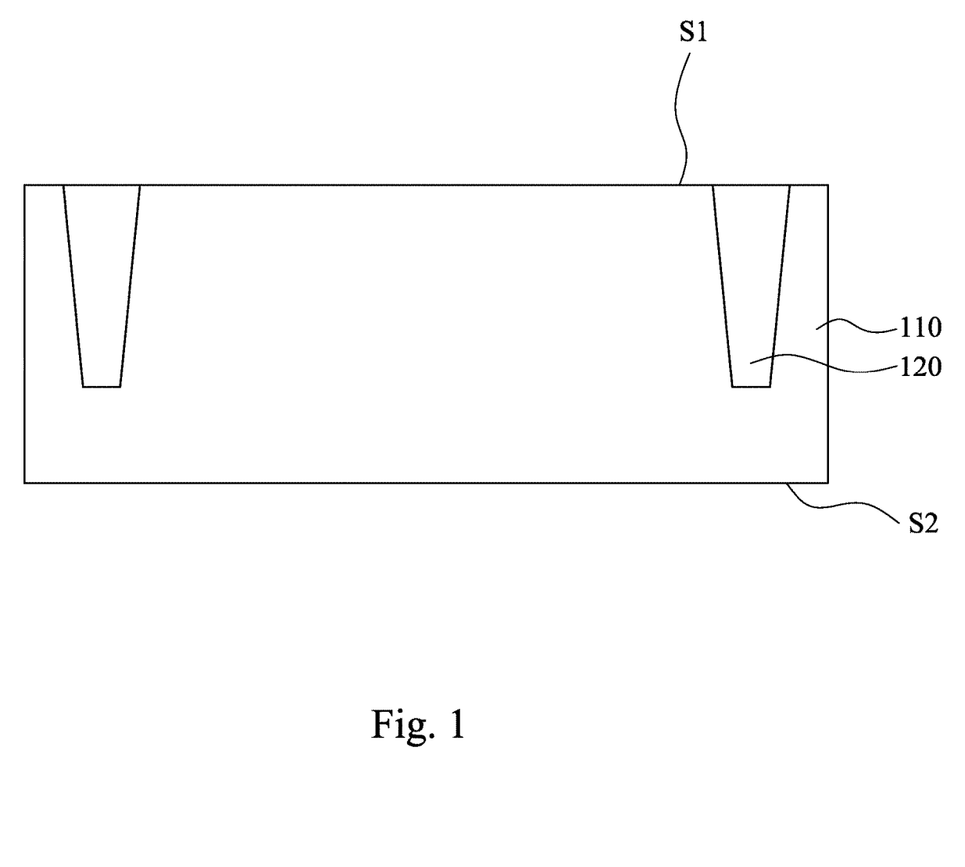
FIGS. 1 through 9 are cross-sectional views at various stages of fabricating the semiconductor device in accordance with some embodiments.

FIGS. 1 through 9 are cross-sectional views at various stages of fabricating the semiconductor device in accordance with some embodiments. Referring now to FIG. 1, a substrate 110 and a shallow trench isolation (STI) feature 120 in the substrate 110 are provided. One should note that some of the structures have been omitted for the purpose of simplicity and clarity. The substrate 110 has a front side S1 and a back side S2, wherein the substrate 110 may be a semiconductor substrate including silicon and/or germanium, a compound semiconductor substrate including silicon carbide, gallium arsenic, gallium phosphide, indium phosphide, indium arsenide, and/or indium antimonide, an alloy semiconductor substrate including SiGe, GaAsP, AlInAs, AlGaAs, GaInAs, GaInP, and/or GaInAsP, or combinations thereof. Furthermore, the substrate 110 may be a semiconductor on insulator (SOI), III-V group-on-silicon (such as GaN-on-silicon) substrate or a graphene-on-silicon substrate. The substrate 110 has a first type of conductivity that may be N-type or P-type conductivity. In some embodiments, the first type of conductivity is P-type conductivity. For example, the substrate 110 is a lightly doped P-type semiconductor substrate such as P-type epitaxial layer (P-epi). The shallow trench isolation feature 120 is an integrated circuit feature which prevents electrical current leakage between adjacent semiconductor device components (such as pixels). The shallow trench isolation feature 120 is typically created early during the fabrication process of semiconductor device, before transistors (such as transfer gate) are formed. The fabrication process of the shallow trench isolation 120 include etching some openings serving as trenches in the substrate 110, depositing one or more dielectric materials (such as silicon dioxide) to fill the trenches, and removing the excess dielectric materials using a technique such as chemical-mechanical polishing (CMP).

Figure 2:
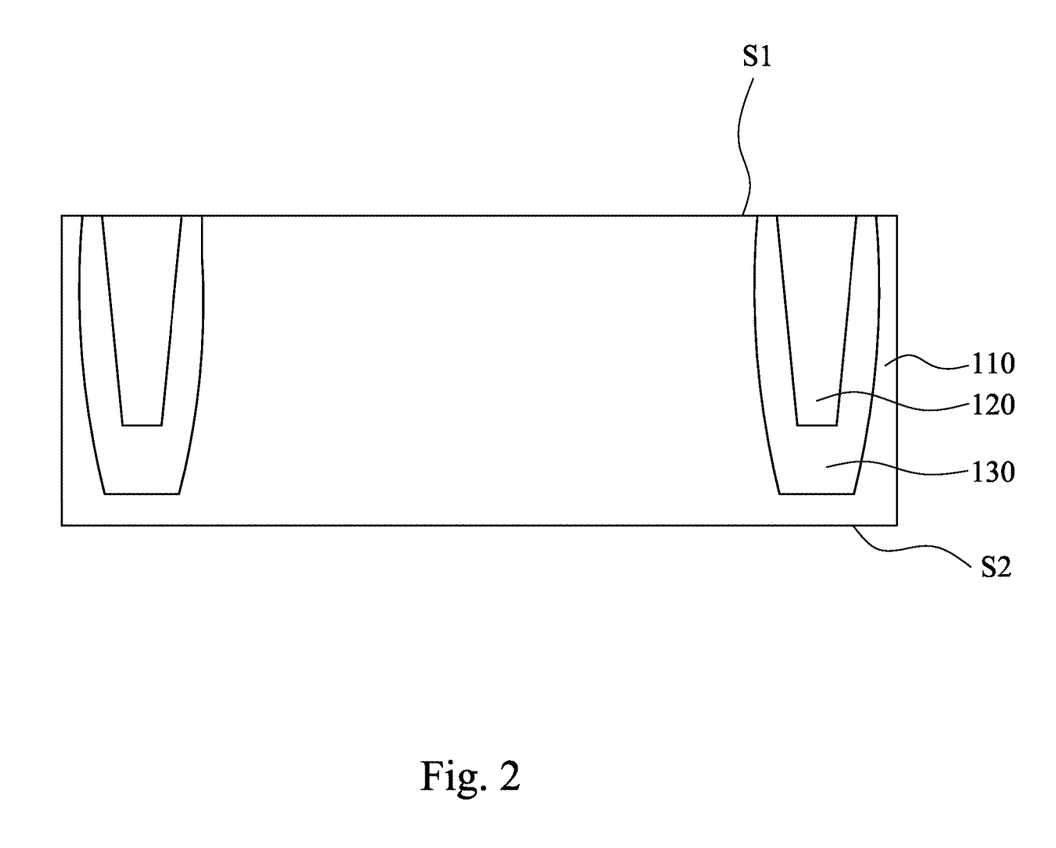

Referring now to FIG. 2, after the shallow trench isolation feature 120 is formed in the substrate 110, the well region 130 is formed substantially under the shallow trench isolation feature 120. The well region 130 may be lightly or intermediately doped with dopants of the first type of conductivity. In some embodiments, the first type of conductivity may be N-type or P-type conductivity. The dopant concentration may depend on the maximum voltage requirement of the semiconductor device. In some embodiments, the well region 130 may be formed by ion implantaion with an implanter using a P-type dopant, such as boron (B), aluminum (Al), gallium (Ga) or a combination thereof. The implanter may provide good control of the dopant concentration and ion penetration depth by the different energy value of the implanter. For example, the ion penetration depth becomes deeper when the energy value of the implanter increases.

Figure 3:
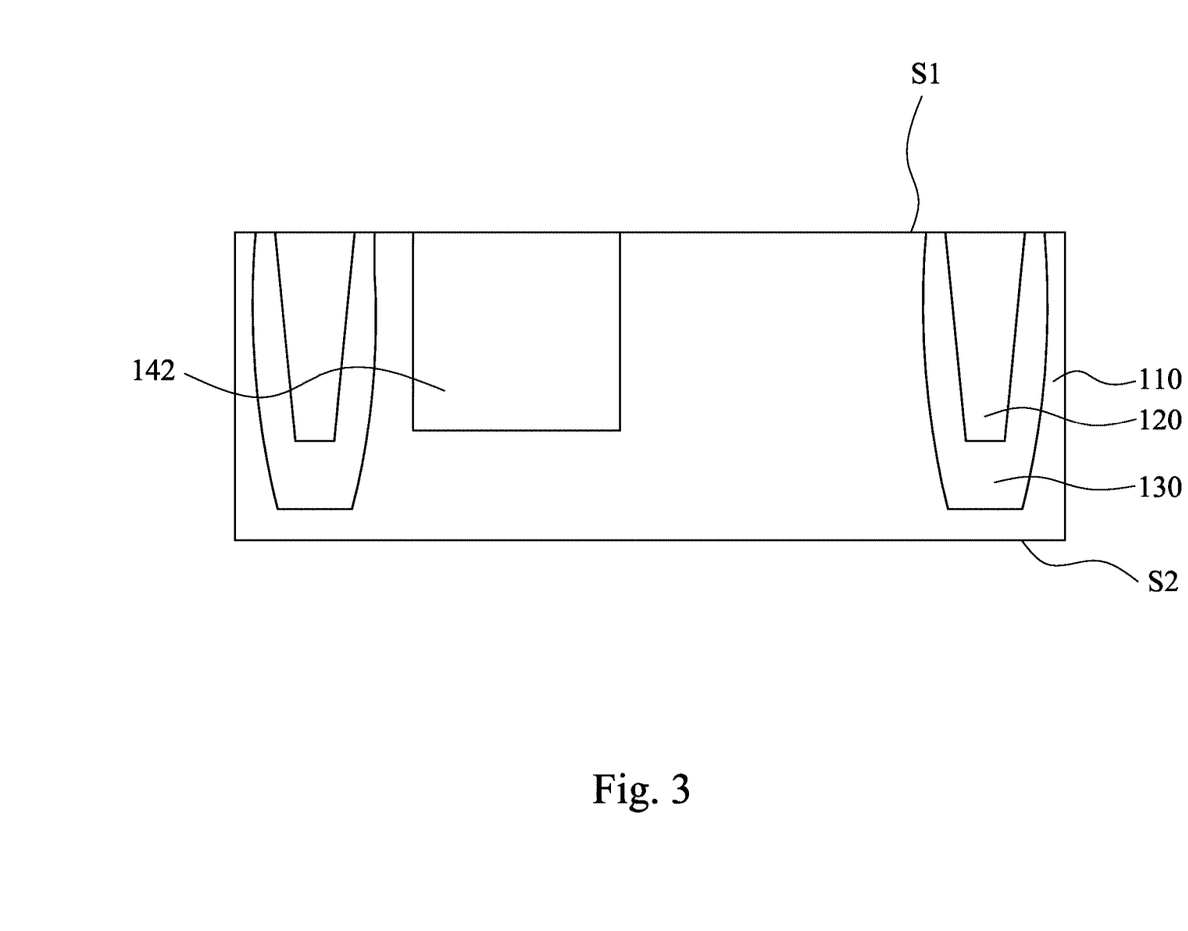

Referring now to FIG. 3, in various embodiments, a second light sensing feature 142 having a second type of conductivity is formed in the substrate 110 near the front side S1. The second type of conductivity opposite to the first type of conductivity, may be N-type or P-type conductivity. In some embodiments, the second type of conductivity is N-type conductivity such that the second light sensing feature 142 is a N-type photodiode which may be formed by ion implantaion with a N-type dopant, such as nitrogen (N), phosphorus (P), arsenic (As) or a combination thereof. In some embodiments, the N-type photodiode is a N-type pinned photodiode (NPPD).

Figure 4:
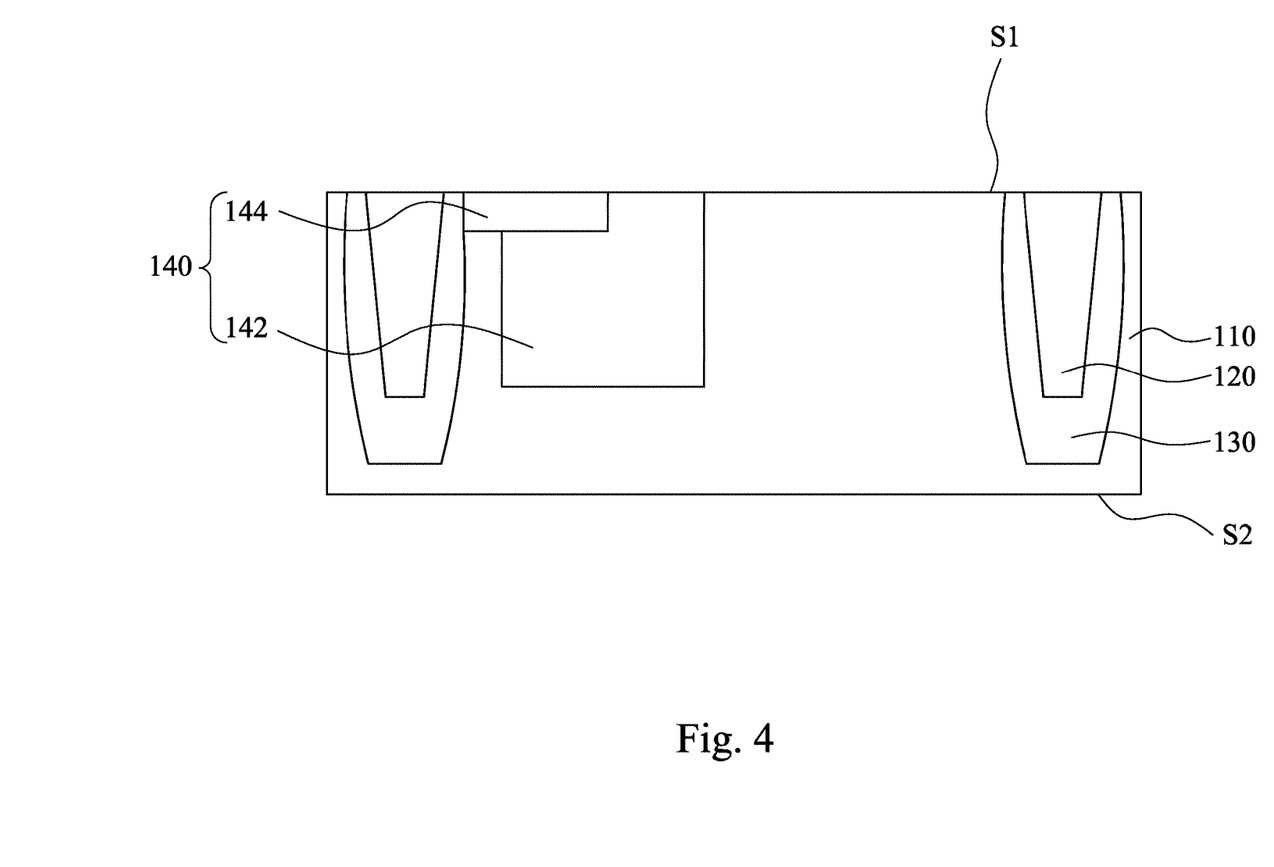

Referring now to FIG. 4, a first light sensing feature 144 having a first type of conductivity is formed in the substrate 110 near the front side S1 and on the second light sensing feature 142. In other words, the second light sensing feature 142 is substantially under the first light sensing feature 144. As shown in FIG. 4, the first light sensing feature 144 and the second light sensing feature 142 are coplanar. The first type of conductivity may be N-type or P-type conductivity. In some embodiments, the first type of conductivity is P-type conductivity such that the first light sensing feature 144 is a P-type photodiode that for example is formed by ion implantaion with a P-type dopant, such as boron (B), aluminum (Al), gallium (Ga) or a combination thereof. In some embodiments, the P-type photodiode is a partially pinned photodiode (PPPD) or a pinned photodiode (PPD). As a result, an light sensing feature 140 is formed by the first light sensing feature 144 and the second light sensing feature 142, and is configured in the substrate 110 to detect an incoming radiation. In some embodiments, the light sensing feature 140 is a photodiode. In some embodiments, the light sensing feature 140 and the substrate 110 thus form a P-N-P junction region for sensing imcoming radiation. In other words, the P-N-P junction region is also a light sensing region and a photoelectric conversion region. During operation, the imcoming radiation that reaches the light sensing feature 140 may generate optical charges or photo-electrons that may be collected and accumulated in the P-N-P junction region. The photo-electrons may be transferred via a transfer gate (not shown) and may be converted into a digital signal. The amount of photo-electrons generated is proportional to the intensity of the number of photons absorbed in the P-N-P junction region.

Figure 5:
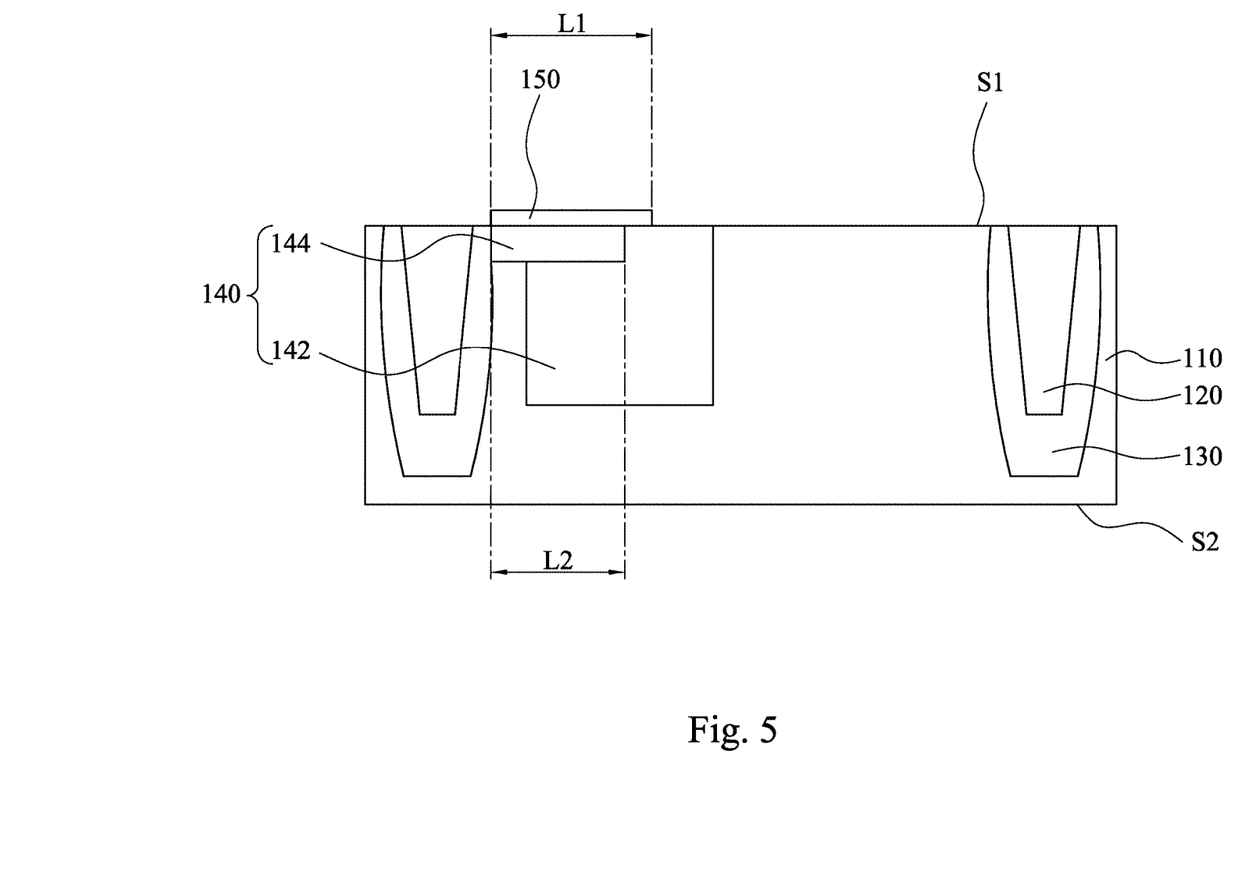

Referring now to FIG. 5, a negative oxide layer 150 is formed over the light sensing feature 140 on the front side S1 and is configured to enhance the isolation, avoid the surface electron scattering, suppress the interfacial defect and reduce the leakage current. Specifically, because some negative electric charges exists in the negative oxide layer 150, the negative oxide layer 150 may attract holes in the light sensing feature 140 and the substrate 110 to accumulate under the negative oxide layer 150 and between the negative oxide layer 150 and the light sensing feature 140, such that generation of electrons of dark current is suppressed. In addition, even if the electrons of dark current are generated, these accumulated holes may eliminate the electrons. In other words, the accumulated holes between the negative oxide layer 150 and the light sensing feature 140 protect the light sensing region by eliminating the electrons of the dark current. As a result, the negative oxide layer 150 is capable of surpressing generation of leakage current such that the white pixel is reduced.

Moreover, compared to the traditional technique which suppresses and reduces generation of a dark current by implanting a P+ layer on the light sensing region, using the negative oxide layer 150 to protect the light sensing region may not damage the light sensing region as ion implantation. Further, the negative oxide layer 150 may be formed in a low temperature process rather than high temperature of annealing as the traditional technique such that the problems of diffusion of impurities may also be improved and the photoelectric conversion characteristic of the light sensing region may avoid to deteriorate.

In some embodiments, the negative oxide layer 150 includes a material of hafnium oxide (HfO), aluminum oxide ($Al_2O_3$), zirconium oxide ($ZrO_3$), tantalum oxide ($Ta_2O_5$), titanium oxide ($TiO_2$) or a combination thereof. The negative oxide layer 150 may be formed by any suitable deposition process. Examples of the deposition process include but are not limited to atomic layer deposition (ALD), chemical vapor deposition (CVD), low pressure chemical vapor deposition (LPCVD), physical vapor deposition (PVD), sputtering and spin-on.

As shown in FIG. 5, in some embodiments, the negative oxide layer 150 is in direct contact with the light sensing feature 140. In other words, the negative oxide layer 150 is in direct contact with the first light sensing feature 144 and the second light sensing feature 142 because the first light sensing feature 144 and the second light sensing feature 142 are coplanar. As a result, the negative oxide layer 150 is close to the light sensing region such that the generation of electrons of dark current may be suppressed or eliminated.

In addition, as shown in FIG. 5, the negative oxide layer 150 is partially over the light sensing feature 140. More specifically, the negative oxide layer 150 is fully over the first light sensing feature 144 of the light sensing feature 140 but is partially over the second light sensing feature 142 of the light sensing feature 140. One edge of the negative oxide layer 150 aligns with one edge of the first light sensing feature 144 and the other edge of the negative oxide layer 150 extends towards the other edge of the first light sensing feature 144 to fully cover the first light sensing feature 144 such that the implement region of light sensing feature 140 may be protected from leakage current. Further, because the negative oxide layer 150 is partially over the light sensing feature 140 and thus is partially over the second light sensing feature 142, an overlap may exists between a transfer gate (not shown) formed in the sebsequent processes and the second light sensing feature 142. In some embodiments, a length L1 of the negative oxide layer 150 is larger than a length L2 of the first light sensing feature 144 such that the first light sensing feature 144 may be fully covered by the negative oxide layer 150. In some embodiments, the length L1 of the negative oxide layer 150 is equal to the length L2 of the first light sensing feature 144 (not shown) and the negative oxide layer 150 is right above the first light sensing feature 144.

Figure 6:
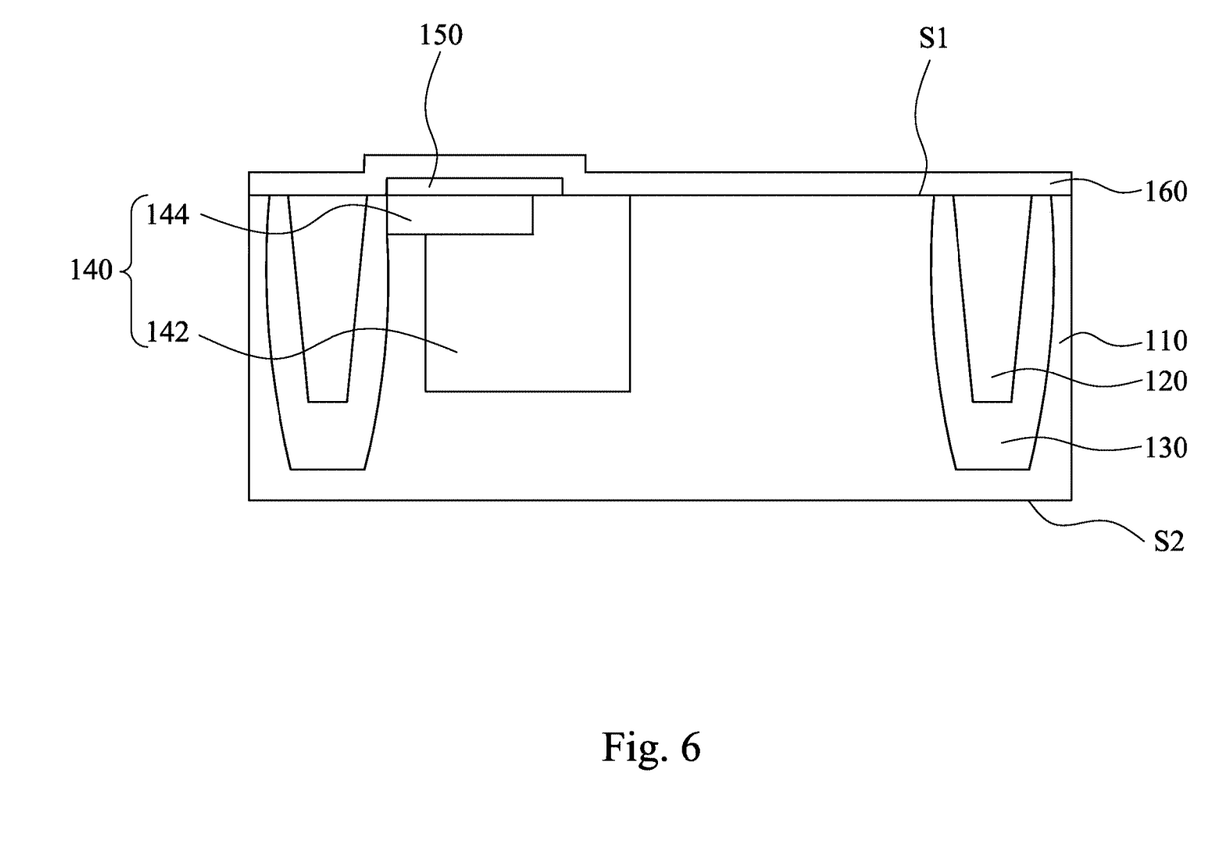

Referring now to FIG. 6, a gate dielectric layer 160 is formed over the negative oxide layer 150. The gate dielectric layer 160 serves to facilitate the subsequent formation of a transfer gate or connecting lines, and to separate the transfer gate 170 from the underlying light sensing feature 140 and S/D region (not shown) in the substrate 110. The gate dielectric layer 160 may be made of silicon dioxide, silicon nitride or other high k dielectric materials. As shown in FIG. 6, the negative oxide layer 150 is between the light sensing feature 140 and the gate dielectric layer 160. In some embodiment, the gate dielectric layer 160 has a thickness in a range of 10 to 5,000 angstroms, depending on operating voltage of the transfer gate (not shown).

Figure 7:
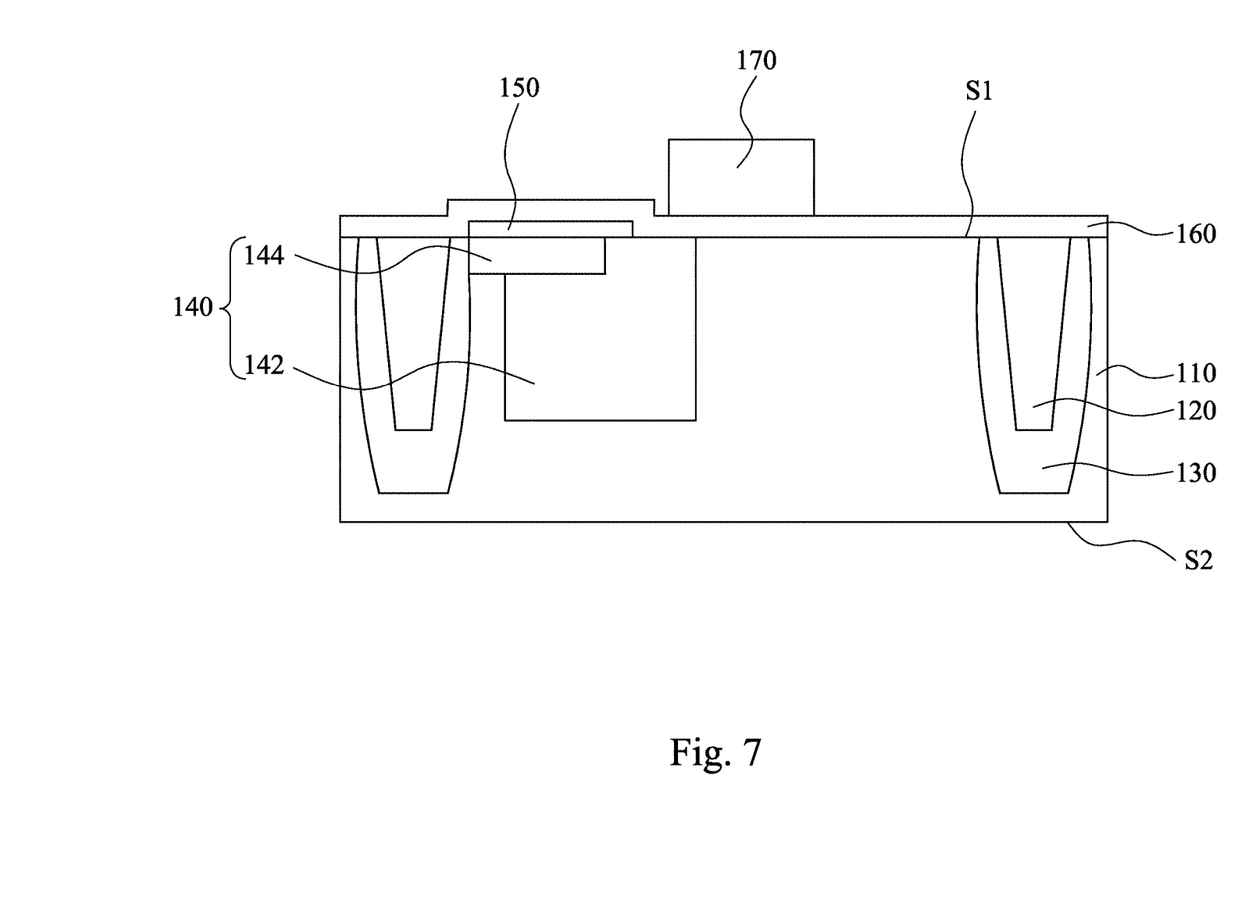

Referring now to FIG. 7, a transfer gate 170 is formed on the gate dielectric layer 160 to control a flow of charge carriers in a channel region formed between the light sensing feature 140 and S/D regions (not shown) beneath the gate dielectric layer 160. As shown in FIG. 7, an overlap exists between the transfer gate 170 and the second light sensing feature 142. The transfer gate 170 may be made of any suitable conductive material. Examples of the suitable conductive material include but are not limited to polysilicon (poly), highly doped silicon, aluminium (Al), refractory metal such as tungsten (W), a silicide (e.g. TiSi, MoSi, TaSi or WSi) and a combination thereof. For example, the transfer gate 170 may be a single layer or multi-layer. Further, the fabrication process of the transfer gate 170 includes forming a transfer gate layer on the gate dielectric layer 150 and then patterning the transfer gate layer to form the transfer gate 170. The transfer gate layer may be formed by atomic layer deposition, chemical vapor deposition, low pressure chemical vapor deposition, physical vapor deposition or spin-on, and may be patterned by etching such as reactive ion etching (RIE).

Figure 8:
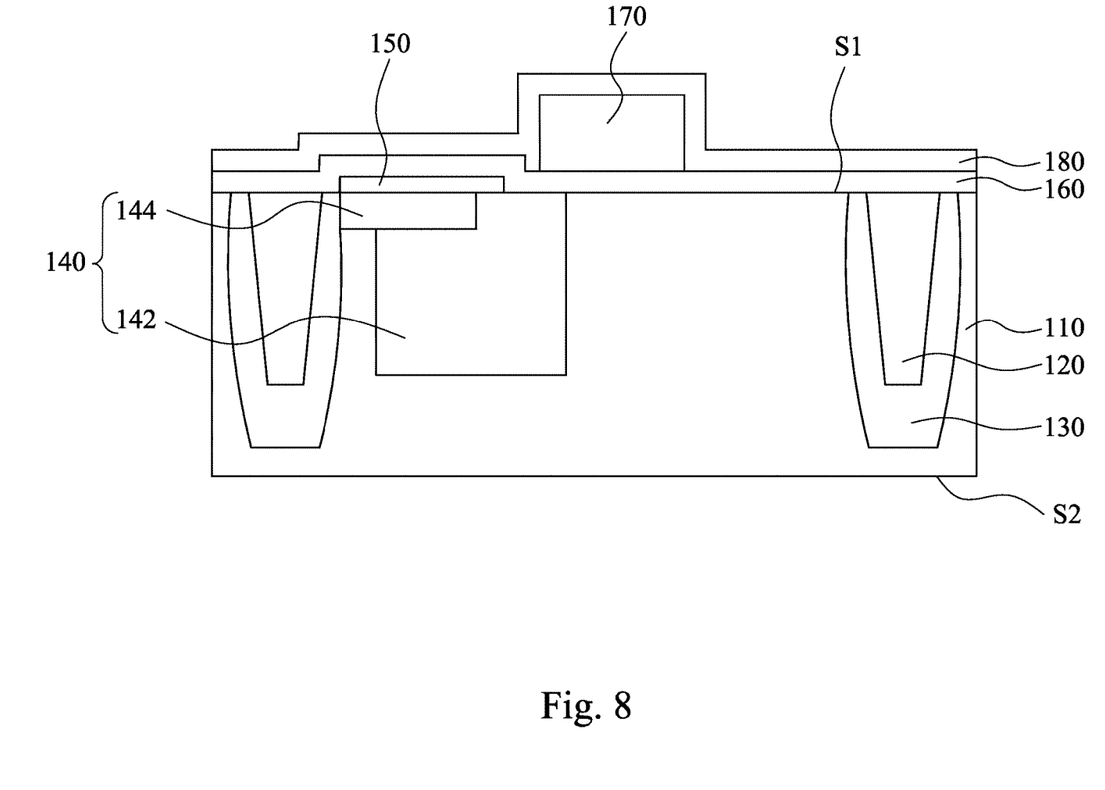

Referring now to FIG. 8, a high temperature oxide (HTO) layer 180 is formed on the gate dielectric layer 160 and the transfer gate 170. For example, the high temperature oxide layer 180 may be formed by a rapid thermal chemical vapor deposition. Next, spacers (not shown) are formed on sidewalls of transfer gate 170 using a conventional deposition process such as chemical vapor deposition. The spacers may be made of any suitable material. Examples of suitable material include but not limit to silicon dioxide ($SiO_2$), silicon nitride (SiN), silicon carbonitride (SiCN) and other high k dielectric material. Further, because the negative oxide layer 150 is over the light sensing feature 140, the portion of high temperature oxide layer 180 right above the negative oxide layer 150 may be thinner than the other portion of high temperature oxide layer 180. Therefore, the extra thermal budget of high temperature oxide layer 180, which adversely affects electrical performance, may be avoided.

Figure 9:
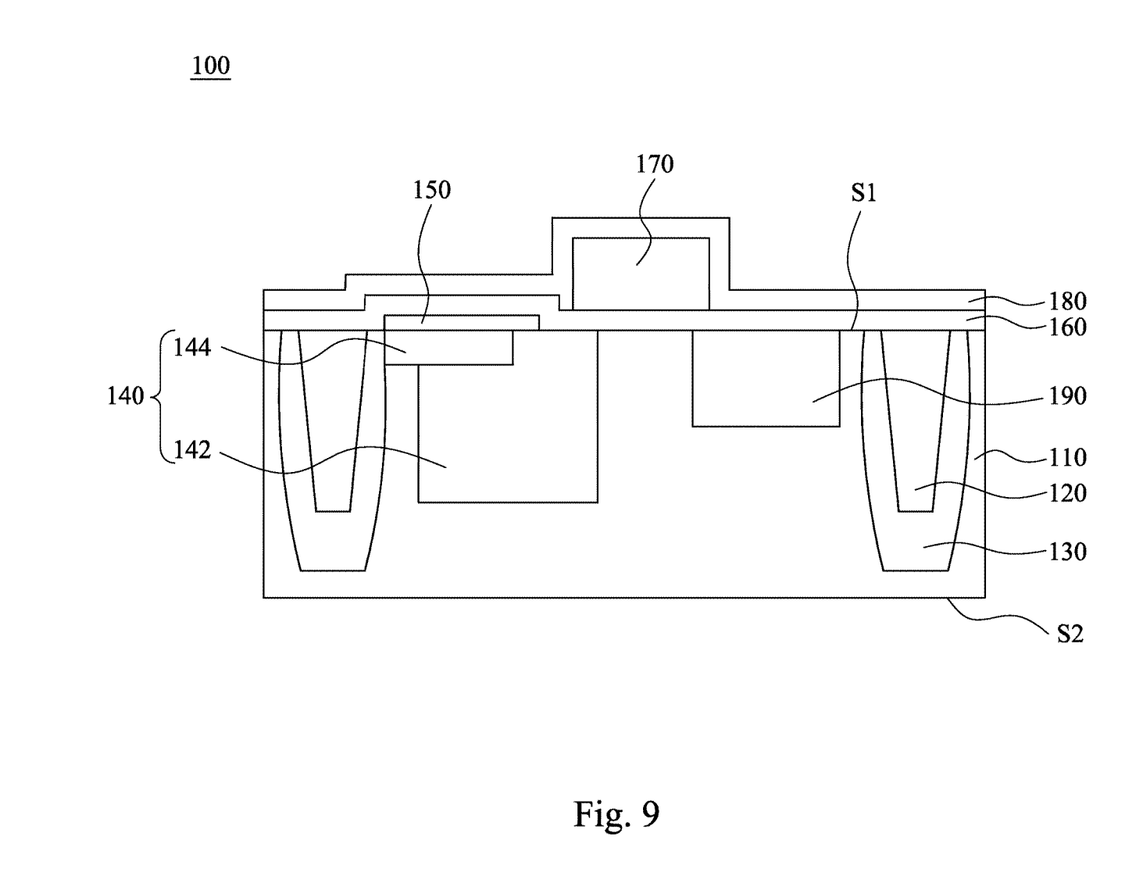

Referring now to FIG. 9, a third light sensing feature 190 having a second type of conductivity opposite to the first type of conductivity, is formed in the substrate 110 near the front side S1 and near the transfer gate 170. The second type of conductivity opposite to the first type of conductivity may be N-type or P-type conductivity. In some embodiments, the third light sensing feature 190 having N-type conductivity is a floating diffusion (FD) region, lightly doped drain (LDD) or S/D region. The third light sensing feature 190 may be formed by ion implantaion with a N-type dopant, such as nitrogen (N), phosphorus (P), arsenic (As) or a combination thereof. As shown in FIG. 9, an overlap exists between the transfer gate 170 and the third light sensing feature 190. In other embodiments, the edge of the third light sensing feature 190 aligns with the edge of transfer gate 170 (not shown).

In some embodiments, a pixel includes the light sensing feature 140, the transfer gate 170, and third light sensing feature 190, wherein the first light sensing feature 144 of the light sensing feature 140 has P-type conductivity, the second light sensing feature 142 of the light sensing feature 140 has N-type conductivity and the third light sensing feature 190 has N-type conductivity. For example, the first light sensing feature 144 is P-type pinned photodiode (PPPD), the second light sensing feature 142 is N-type pinned photodiode (NPPD) and the third light sensing feature 190 is floating diffusion (FD) region. Even though only one pixel is shown in FIG. 9, it is understood that the semiconductor device 100 may includes a plurality of pixels to form an array of pixel. The transfer gate 170 is a gate of a switch transistor used in the pixel to transfer the charges from one side of a device to another. In some embodiments, the transfer gate 170 is used to transfer the charges from the light sensing feature 140 to the third light sensing feature 190. Further, the third light sensing feature 190 may be formed by self-aligned (SA) with the transfer gate 170 when the spacers (not shown) are formed after the third light sensing feature 190 or is even not formed at all. Alternatively, the third light sensing feature 190 may be formed by self-aligned with the spacers when the spacers are formed before the third light sensing feature 190.

The semiconductor device 100 includes the substrate 110, the light sensing feature 140 in the substrate 110, the negative oxide layer 150 over the light sensing feature 140, the gate dielectric layer 160 over the negative oxide layer 150, the transfer gate 170 over the gate dielectric layer 160 and the high temperature oxide layer 180 over the gate dielectric layer 160 and the transfer gate 170. In some embodiments, because the imcoming radiation is directed towards the light sensing feature 140 from the front side S1 of the substrate 110 or from the back side S2 of the substrate 110, the semiconductor device 100 may be a frontside illuminated (FSI) CMOS image sensor or a backside illuminated (BSI) CMOS image sensor. If the imcoming radiation is directed towards the light sensing feature 140 from the back side S2 and an interconnect layer (not shown) is formed on the front side S1, such semiconductor device 100 is a backside illuminated CMOS image sensor.

Figure 10:
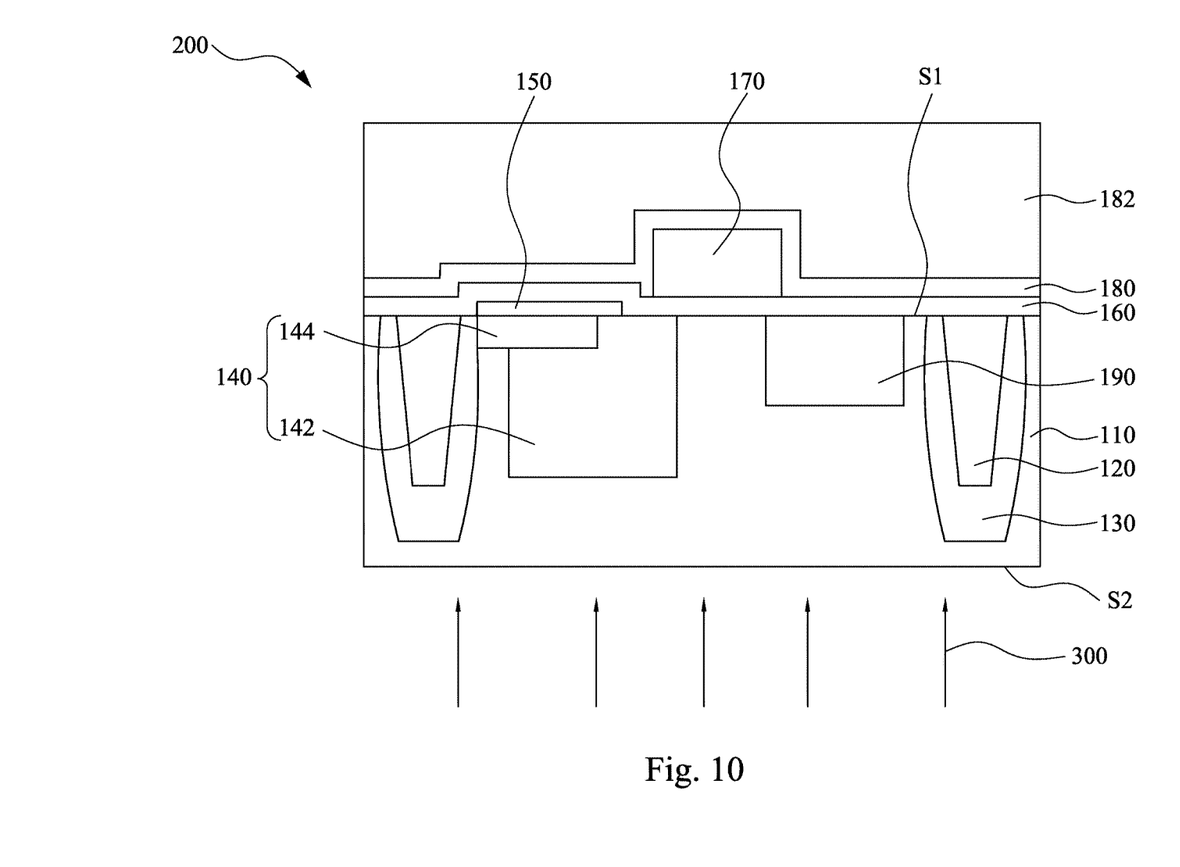
FIG. 10 is a cross-sectional view of the backside illuminated CMOS image sensor in accordance with some embodiments.

Referring now to FIG. 10, illustrated is a cross-sectional view of the backside illuminated CMOS image sensor in accordance with some embodiments. The backside illuminated CMOS image sensor 200 includes a light sensing feature 140 configured in the substrate 110 to detect an incoming radiation 300 and an interconnection layer 182 over the high temperature oxide layer 180. In some embodiments, the light sensing feature 140 is a photodiode. Similar features in FIG. 9 and FIG. 10 are numbered the same for simplicity and clarify. The interconnection layer 182 may includes a plurality of dielectric layers, such as inter-layer dielectrics (ILD) or inter-metal dielectrics (IMD), and a plurality of metal layers (not shown), that can be formed by well-known semiconductor processing techniques. As shown in FIG. 10, the light sensing feature 140 is between the incoming radiation 300 and the interconnection layer 182. Further, after the pixel including the light sensing feature 140, the transfer gate 170, and third light sensing feature 190, is formed in the substrate, the substrate 110 may be thinned from the back side S2 to reduce the thickness of the substrate 110 to help the incoming radiation 300 to reach the light sensing feature 140 more easily. The thinning method can be performed by chemical mechanical polishing (CMP) or blanket etching process, for example. The differences between the backside illuminated CMOS image sensor 200 and the semiconductor device 100 are that the backside illuminated CMOS image sensor 200 further includes the interconnection layer 182 over the high temperature oxide layer 180. These differences do not affect the function of each element in the embodiment, and thus the backside illuminated CMOS image sensor 200 has the same functions and advantages as the semiconductor device 100.

Moreover, because the light sensing feature 140 is between the incoming radiation 300 and the interconnection layer 182, the backside illuminated CMOS image sensor 200 provides an unobstructed path for the imcoming radiation 300 to reach the light sensing feature 140 such that the imcoming radiation 300 may avoid blockage by the metal layers and dielectric layers of the interconnect layer 182. The light sensing feature 140 is exposed to incoming radiation 300 from the back side S2 of the substrate 110. Thus, there is no need to create a path through the front side S1 to the light sensing feature 140.

The embodiments of the present disclosure discussed above have advantages over existing methods and systems. The semiconductor device, which includes the negative oxide layer, is beneficial for preventing and reducing generation of leakage current. The negative oxide layer is formed over the light sensing region and is configured to enhance the isolation, avoid the surface electron scattering, suppress the interfacial defect and reduce the leakage current. Specifically, because some negative charges exist in the negative oxide layer, the negative oxide layer may attract holes to accumulate under the negative oxide layer and between the negative oxide layer and the light sensing region, such that generation of electrons of dark current may be suppressed and reduced. In addition, even if the electrons of dark current are generated, these accumulated holes may eliminate the electrons. As a result, the negative oxide layer protecting the light sensing region is capable of surpressing and reducing generation of leakage current such that the performance of white pixel is improved. Moreover, compared to the traditional technique which suppresses generation of a dark current by implanting a P+ layer on the light sensing region, using the negative oxide layer to protect the light sensing region may not damage the light sensing region as ion implantation. Further, the negative oxide layer may be formed in a low temperature process rather than high temperature of annealing as the traditional technique, such that the problems of diffusion of impurities may also be improved and the photoelectric conversion characteristic of the light sensing region may avoid to deteriorate. Further, because the negative oxide layer is over the photodiode, the portion of high temperature oxide layer right above the negative oxide layer may be thinner than the other portion of high temperature oxide layer. Therefore, the extra thermal budget of high temperature oxide layer, which adversely affects electrical performance, may be avoided.

In various embodiments of the present disclosure, the semiconductor device includes a substrate, a light sensing feature, a negative oxide layer, a gate dielectric layer and a gate dielectric layer. The light sensing feature is configured in the substrate to detect an incoming radiation. The negative oxide layer is over the light sensing feature. The gate dielectric layer is over the negative oxide layer. The transfer gate is over the gate dielectric layer.

In various embodiments of the present disclosure, the CMOS image sensor includes a substrate, an photodiode, a negative oxide layer, a gate dielectric layer and a gate dielectric layer. The substrate has a first type of conductivity. The photodiode in the substrate includes a first light sensing feature having the first type of conductivity and a second light sensing feature having a second type of conductivity under the first light sensing feature. The negative oxide layer is fully over the first light sensing feature of the photodiode. The gate dielectric layer is over the negative oxide layer. The transfer gate is over the gate dielectric layer.

In various embodiments of the present disclosure, the method of fabricating semiconductor device includes the following operations. A substrate having a first type of conductivity is provided. A photodiode is formed in the substrate. A negative oxide layer is formed over the photodiode. A gate dielectric layer is formed over the negative oxide layer. A transfer gate is formed over the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a light sensing feature configured in the substrate to detect an incoming radiation;
a negative oxide layer over the light sensing feature;
a gate dielectric layer over the negative oxide layer and the substrate; and
a transfer gate over the gate dielectric layer, wherein the negative oxide layer has a first vertical projection on the substrate, the transfer gate has a second vertical projection on the substrate, and the first vertical projection is spaced apart from the second vertical projection.

2. The semiconductor device of claim 1, wherein the negative oxide layer comprises a material of HfO, $Al_2O_3$, $ZrO_3$, $Ta_2O_5$, $TiO_2$ or a combination thereof.

3. The semiconductor device of claim 1, wherein the negative oxide layer is in direct contact with the light sensing feature.

4. The semiconductor device of claim 1, wherein the negative oxide layer is partially over the light sensing feature.

5. The semiconductor device of claim 1, further comprising an interconnection layer over the transfer gate, wherein the light sensing feature is between the incoming radiation and the interconnection layer.

6. The semiconductor device of claim 1, wherein the light sensing feature is a photodiode.

7. A CMOS image sensor, comprising:
   a substrate having a first type of conductivity;
   a photodiode in the substrate, comprising a first light sensing feature having the first type of conductivity and a second light sensing feature having a second type of conductivity under the first light sensing feature;
   a negative oxide layer fully over the first light sensing feature of the photodiode;
   a gate dielectric layer over the negative oxide layer and the substrate; and
   a transfer gate over the gate dielectric layer, wherein the negative oxide layer has a first vertical projection on the substrate, the transfer gate has a second vertical projection on the substrate, and the first vertical projection is spaced apart from the second vertical projection.

8. The CMOS image sensor of claim 7, wherein a length of the negative oxide layer is larger than a length of the first light sensing feature.

9. The CMOS image sensor of claim 7, wherein the negative oxide layer comprises a material of HfO, $Al_2O_3$, $ZrO_3$, $Ta_2O_5$, $TiO_2$ or a combination thereof.

10. The CMOS image sensor of claim 7, wherein the first light sensing feature is in direct contact with the negative oxide layer.

11. The CMOS image sensor of claim 7, wherein the negative oxide layer is partially over the second light sensing feature.

12. The CMOS image sensor of claim 7, further comprising a third light sensing feature having the second type of conductivity in the substrate.

13. The CMOS image sensor of claim 12, wherein the first type of conductivity is P-type conductivity and the second type of conductivity is N-type conductivity.

14. The CMOS image sensor of claim 7, wherein the first light sensing feature is P-type photodiode and the second light sensing feature is N-type photodiode.

15. A method for fabricating a semiconductor device, comprising:
    providing a substrate having a first type of conductivity;
    forming a photodiode in the substrate;
    forming a negative oxide layer over the photodiode, wherein the negative oxide layer has a first vertical projection on the substrate;
    forming a gate dielectric layer over the negative oxide layer and the substrate; and
    forming a transfer gate over the gate dielectric layer, wherein the transfer gate has a second vertical projection on the substrate, and the first vertical projection is spaced apart from the second vertical projection.

16. The method of claim 15, wherein forming the photodiode comprises forming a second light sensing feature having a second type of conductivity opposite to the first type of conductivity in the substrate and forming a first light sensing feature having the first type of conductivity on the second light sensing feature.

17. The method of claim 16, further comprising forming a third light sensing feature having the second type of conductivity in the substrate.

18. The method of claim 15, wherein the negative oxide layer is in direct contact with the photodiode.

19. The method of claim 15, wherein forming the negative oxide layer is performed by atomic layer deposition (ALD), chemical vapor deposition (CVD), low pressure chemical vapor deposition (LPCVD), physical vapor deposition (PVD), sputtering or spin-on.

20. The method of claim 15, further comprising forming an interconnection layer over the transfer gate.

* * * * *